United States Patent [19]
Sichmann

[11] Patent Number: 5,266,178
[45] Date of Patent: Nov. 30, 1993

[54] SPUTTERING CATHODE

[75] Inventor: Eggo Sichmann, Gelnhausen, Fed. Rep. of Germany

[73] Assignee: Leybold Aktiengesellschaft, Hanau, Fed. Rep. of Germany

[21] Appl. No.: 827,134

[22] Filed: Jan. 28, 1992

[30] Foreign Application Priority Data

Oct. 31, 1991 [DE] Fed. Rep. of Germany ....... 4135939

[51] Int. Cl.$^5$ .............................................. C23C 14/34
[52] U.S. Cl. ......................... 204/298.19; 204/298.08; 204/298.16; 204/192.12
[58] Field of Search ................... 204/192.12, 298.08, 204/298.12, 298.16, 298.17, 298.19, 298.18

[56] References Cited

U.S. PATENT DOCUMENTS

| 4,370,217 | 1/1983 | Funaki | 204/298.19 X |
| 4,391,697 | 7/1983 | Morrison, Jr. | 204/298.19 |
| 4,405,436 | 9/1983 | Kobayashi et al. | 204/298.16 |
| 4,515,675 | 5/1985 | Kieser et al. | 204/298 |
| 4,572,776 | 2/1986 | Aichert et al. | 204/298.19 X |
| 4,933,064 | 6/1990 | Geisler et al. | 204/298.17 |

FOREIGN PATENT DOCUMENTS 4000941 8/1990 Fed. Rep. of Germany .

*Primary Examiner*—Nam Nguyen
*Attorney, Agent, or Firm*—Felfe & Lynch

[57] ABSTRACT

The invention relates to a sputtering cathode for coating substrates in cathode sputtering apparatus, with a cathode base body 5, a target of nonmagnetic material disposed thereon and having at least one flat sputtering surface 9a, a magnet system 7 with pole faces 7c, 7d, of opposite polarity lying on both sides of the target margins for the production of a closed tunnel of magnetic lines of force overarching the sputtering surface 9a, while the pole shoes 23, 24, surrounding the target reach at least to the outer boundary of the target 9 or partially overlap the latter.

7 Claims, 2 Drawing Sheets

SPUTTERING CATHODE

The invention relates to a sputtering cathode for coating substrates in cathode sputtering apparatus with a cathode base body, a target of nonmagnetic material disposed thereon with at least one flat sputtering surface, a magnet system with pole faces of opposite polarity lying on both sides of the target edges for the production of a closed tunnel of magnetic lines of force spanning the sputtering surface.

German Patent DE 22 43 708 A1 has disclosed a bar cathode with a cylindrical target having flange-like projections of target material at both ends. By a careful coordination of the corresponding magnet system the space around the cylinder and between the flange-like projections can be filled with magnetic lines of force running virtually parallel to the cylinder axis. With such a system the uniformity of the target erosion is substantially improved, but it provides a negligible improvement in the rate of deposition. This is because the material of the target is sputtered away in all directions—"roundabout," so to speak, which makes sense only if the substrates, too, are arrayed in the tightest possible arrangement around the bar cathode. The principle of uniform target erosion, however, does not bring success if large-area substrates are arranged on a plate-like or frame-like carrier on one side of the post cathode. It is only a fraction of the sputtered target material that reaches such substrates. Now, the important thing is not so much to increase the sputtering rate as it is to increase the rate of deposition on the substrates.

In another generally known post cathode with the bilateral flanges on the target, the target length and with it the distance between the flanges must always be adapted to the maximum coating width of the substrates. This is because the direction of movement of the substrates has to be perpendicular to the longitudinal axis of the post cathode. In the case of a substrate 3 meters wide (windowpane) the flange would thus have to have a spacing of 3.20 meters in order to avoid the effect of inhomogeneity at the two ends of the cathode. The uniform distribution of the sputtering rate, and hence of the magnetic field, that is required for the achievement of a uniform coating thickness over the entire width of the substrate is a virtually insoluble problem in the case of such cathode lengths. German Patent Disclosure Document 34 11 536 has disclosed a sputtering cathode in which the pole faces of the magnet system lie laterally alongside the inner and outer boundary surfaces of the plate-like target, which is ring-like in plan (circular ring-like, oval, or rectangular frame-like). Thus, the curvature of the magnetic lines of force relative to the target dimensions which have to be spanned by the lines of force is definitely reduced, causing the width of the erosion pit to increase accordingly, so that a substantially better utilization of the material is the result.

Also known is a sputtering cathode for coating substrates in cathode sputtering apparatus, which is equipped with a cathode base body provided with a recess and a target of nonmagnetic material disposed thereon and having at least one flat sputtering surface. In the corresponding magnet system shielding is provided On both sides of the target margins (DE 35 27 626 A1). Such shielding is complex and expensive.

It is here that the invention seeks to provide a remedy. The problem is solved in accordance with the invention in that the pole shoes surrounding the target reach at least as far as the outer boundary of the target. In this manner it is possible with simple constructional means to reduce the sputtering rate at the pole shoes substantially or even completely eliminate it in a cost-reducing manner. Furthermore, the advantageous configuration of the pole shoes eliminates the need for the known, complicated shielding. The advantageous configuration of the pole shoes is made up of two components, among others: on the one hand the electrostatic force acting on the electrons causes the electrons to issue vertically out of the target surface and to be deflected toward the center of the target by the pole shoes, which are also negatively charged, and furthermore the pole shoe extensions prevent, in a cost-saving manner, any lateral migration of the electrons away from the target surface.

This has the advantage that the profile of the erosion that forms in the target is flat, so that a uniform distribution of the coating thickness takes place on the substrate. Furthermore, the target efficiency is substantially improved, and the life of the target is lengthened, since deep pits in the target are avoided in the sputtering process.

Through the configuration of the pole shoes according to the invention the target surface can advantageously be made flat, without lateral flanges, so that the cost of machining for the production of the target can be considerably reduced. Furthermore, the inner and outer ring disposed near the target surface with a dark-space interval, which is normally necessary, is no longer required.

To this end it is advantageous that the end faces of the pole shoes are configured as extensions.

It is furthermore advantageous for the extensions to be ring-like.

An additional possibility, according to a further development of the apparatus according to the invention, is for the annular extensions to have approximately the same thickness as the pole shoes.

In further development of the invention, it is advantageous for the extensions to be disposed on the same diameter as the pole shoes.

According to a preferred embodiment of the solution offered by the invention, it is lastly provided that the ring-like extensions placed on the pole shoes are configured as a ferromagnetic system and have an optional or negative potential.

It is of special importance to the present invention that the ring-like extension placed on the pole shoes be connected by an electrical conductor to a voltage source and/or a current regulator. Thus, depending on the setting of the potential, different levels of the sputtering rate can be produced at the pole shoes and, depending on the nature, can be reduced to approximately zero. Depending on the configuration of the magnetic field the potential at the pole shoes is lower than at the target.

In connection with the configuration and arrangement according to the invention it is advantageous for a voltage between 50 V and 250 V to be present between the pole shoes and the target.

It is furthermore advantageous for the voltage between the pole shoes and the target to be adjustable, the set level of the current being equal to or approximately zero. If the set current level is established or it is assured that no current flows, the sputtering rate can be reduced to a minimum at the pole shoes, so that advantageously sputtering occurs only at the exposed target surface. This also makes it possible to coat a ferromagnetic material.

Also, it is advantageous for the extensions of the pole shoes to have a different-size diameter than the target in order thus to influence the coating thickness or coat different surfaces with the same target configuration.

It is furthermore advantageous for the negative voltage at the pole shoes between cathode potential and anode potential to be produced by an electrical voltage divider instead of having an additional power supply, and for the negative potential of the pole shoes to be able to be removed after ignition of the plasma.

Additional advantages and details of the invention are set forth in the claims and in the description, and represented in the drawings, and it is to be noted that all of the individual characteristics and all combinations of individual characteristics are important to the invention.

The invention is represented in the drawings by way of example in the form of an embodiment, though it is not limited to this embodiment.

BRIEF DESCRIPTION OF THE DRAWINGS

In FIGS. 1 and 2 is shown a cathode base body 5 which comprises a ferromagnetic material and at the same time forms the yoke for the magnet system to be described below. The cathode base body 5 has a planar top surface 6 containing ring-like supporting surfaces 6a and 6b for the permanent magnets of a magnet system 7. This comprises an inner ring magnet 7a and a closed outer series of bar magnets 7b, all of which are magnetized axially with respect to the axis A—A of the system, such that the polarity of the inner ring magnet 7a is the reverse of that of the outer bar magnets 7b. The polarity is indicated in FIG. 1. The magnets have pole faces 7c and 7d on the side facing away from the cathode base body 5 and lying in a common plane.

Figure 1:
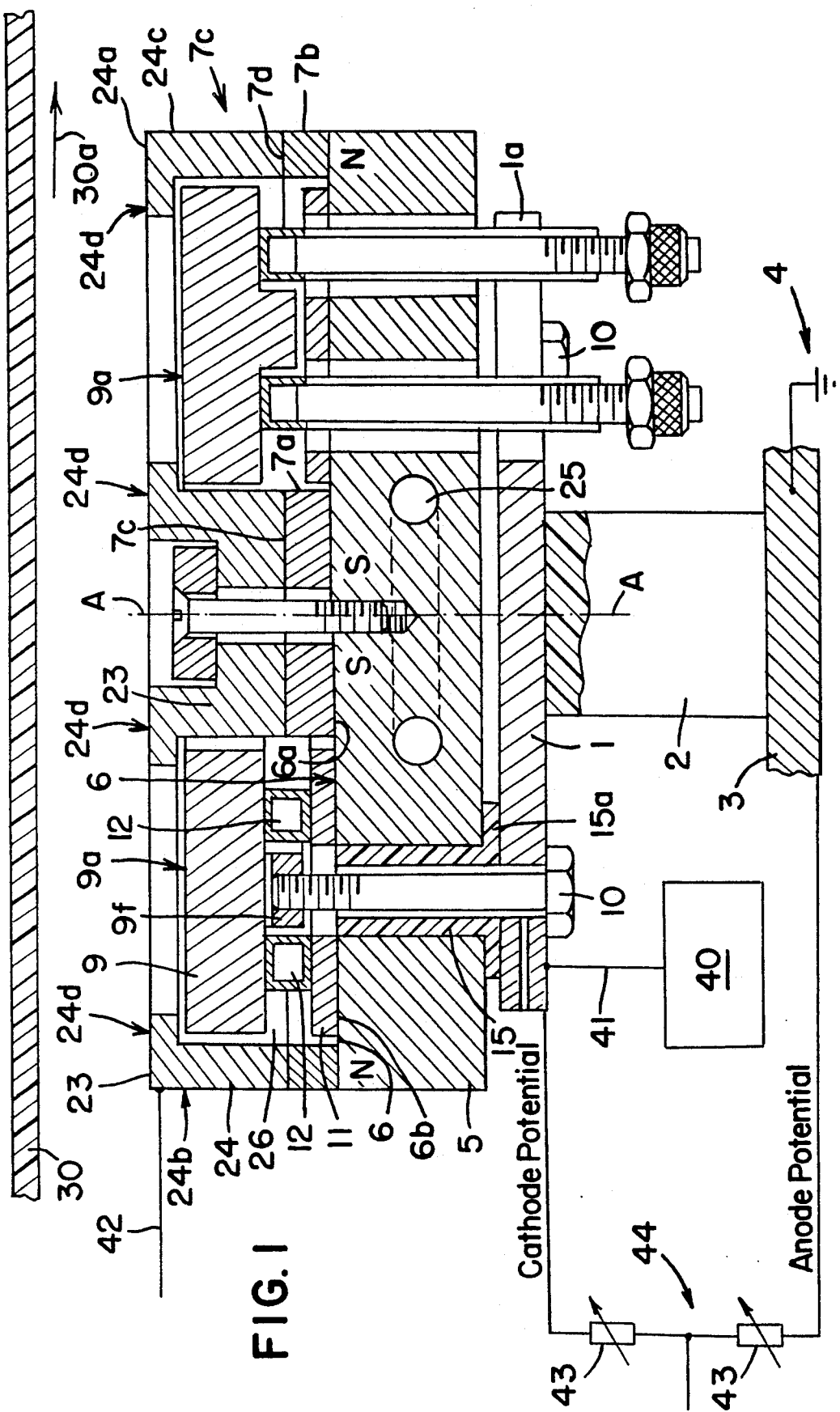
FIG. 1 shows a cathode base body which consists of a ferromagnetic material and simultaneously forms the magnet yoke for the magnet system, the target sputtering surface being planar and the pole shoes being provided with a pole shoe extension.

On the pole faces 7c and 7d lie soft-magnetic pole shoes 23 and 24, the arrangement being such that between the permanent magnets and the pole shoes 23 and 24 a hollow cylindrical chamber 26 is formed which runs continuously about the axis A—A and is open at the top.

Between the supporting surfaces 6a and 6b (FIG. 2) lies a continuous ring-like surface 8 forming the floor of the hollow cylindrical chamber 26. On this surface 8 lies an insulating body 11 which serves to support a target 9. Target 9 forms the starting material for the coatings to be deposited on a substrate or Compact Disk 30, which here is represented only by way of indication. The target 9 has a flat sputtering surface 9a which is defined on both sides by two continuous projections 9b and 9c lying concentrically one within the other, which consist of the same nonmagnetic material as the rest of the target 9.

Figure 2:
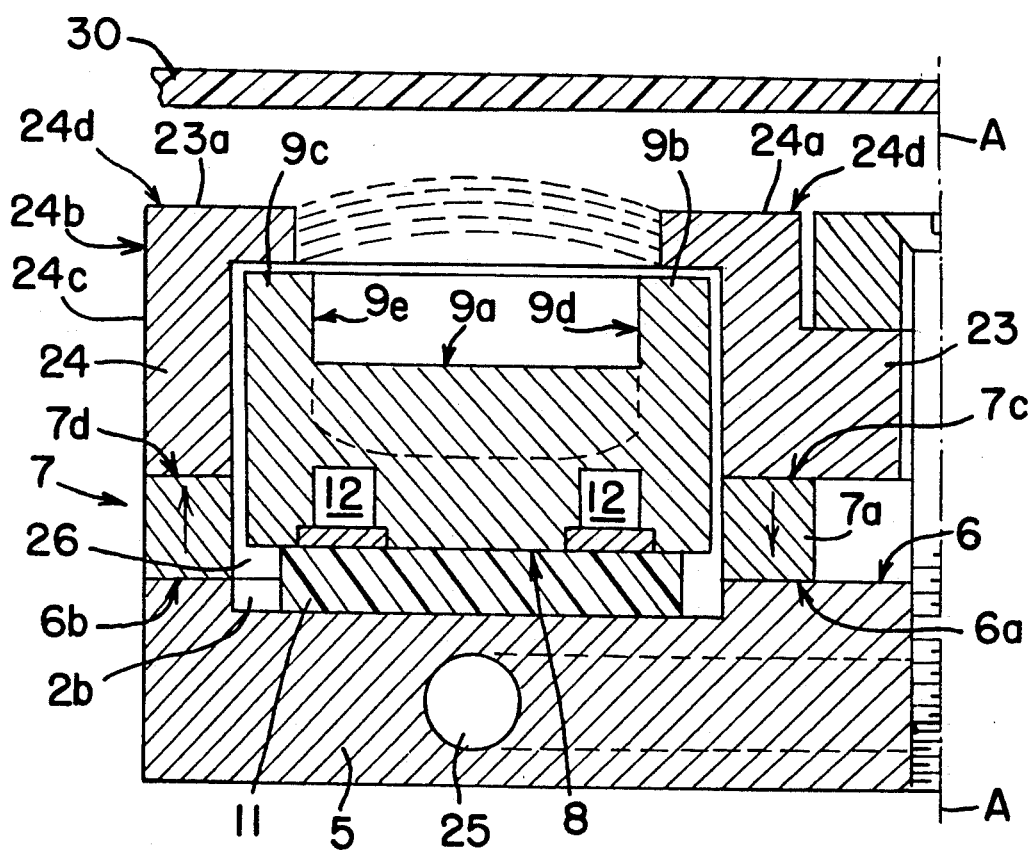
FIG. 2 shows a second embodiment of a sputtering cathode which can be installed into any target, similarly to FIG. 1, the target being provided with a recess.

As it appears from FIG. 1, the target 9 can be provided with the flat sputtering surface 9a, or in accordance with FIG. 2 can be surrounded by the projections 9b, 9c, the sputtering surface 9a being able to be equipped with a concentric warp, or the pole shoes being equipped with a similar pole shoe extension or extension portions 24b as in FIG. 1. The projections 9b and 9c, according to FIG. 2, have opposite walls 9d and 9e whose ends are perpendicular to the sputtering surface 9a. In the present case the walls are cylindrical surfaces.

The pole shoes 23 and 24 have at their end faces and their walls defining the hollow cylindrical chamber 26 the pole faces 23a and 24a, these numbers being shown only on the end faces. The pole faces 23a and 24a reach above the plane of the sputtering surface 9a on both sides of the projections 9b and 9c (FIG. 2) and the sputtering surface 9a between them to such a degree that an important portion of the magnetic lines of force issues perpendicularly from the wall 9e of projection 9c and, after crossing the sputtering surface 9a, enters the wall 9c of projection 9b again in a mostly perpendicular direction. In this manner the above-described advantageous effects are achieved in regard to an extremely uniform erosion of the sputtering surface 9a and a high sputtering rate. The sputtering process is then best halted when the original sputtering surface 9a has eroded to the broken line appearing beneath it. The magnetic lines of force running approximately parallel to the pole faces 23a and 24a are represented in broken lines above the sputtering surface 9a. The shape of the lines of force has the advantage that an erosion profile forms in the target 9 that is flat, so that a uniform distribution of the coating density is achieved on the substrate 30. Also, this greatly improves the target efficiency.

However, to be able to ignite a plasma the electrons must be held and focused in a circulating path on the target surface. This is achieved advantageously by the vertical component of the magnetic field. It is to be noted that magnetic coating sources are distinguished by the fact that a usually constant magnetic field is developed at the target surface. The purpose of this magnetic field is, as already mentioned, to concentrate electrons around the target surface, the electrons being deflected perpendicularly to the direction of the lines of force. This makes it possible to focus the electrons on the center of the target in a magnetic field created largely parallel to the target surface.

To prevent the electrons from migrating to the side, the extensions 24b are advantageously provided on the pole shoes 24, which can be drawn around the pole face 24a. The electrons are prevented by the electrical and geometric influences from leaving the target surface or sputtering surface 9a. The electronic influence is brought about by the fact that electrically conductive plates or extensions 24b reach up at least to the sputtering area of the target 9. These extensions can be connected by an electrical conductor 42 to the cathode potential and to the target 9. A resistance 43 or a power supply unit 40 can be connected to the electrical conductor 42. The resistance 43 is considerably higher than the plasma impedance. For expansion, the power supply unit can be equipped with a current control between cathode and target 9 and the target plates or extensions 24b of the pole shoes in order to be able to vary the electrical influence. The extensions 24b can be combined integrally or removably with the rest of the pole shoe 24.

The ablation of the sheet-metal material of the extensions 24b can be varied or almost completely prevented according to the size of the resistance or the setting of the current at the power supply.

If the sheet metals are made of ferromagnetic material as extended pole shoes 24b (FIGS. 1 and 2), a largely parallel magnetic field is thus automatically produced, which favors a uniform ablation of the material to be sputtered.

The pole shoes 23 and 24 consist of a vertical portion 24c and the horizontal portion 24d which focus the electrons.

As it can be seen in FIGS. 1 and 2, the pole shoes 23 and 24 are extended at their face ends at least as far as the target surface or sputtering surface 9a.

To be able to carry away the heat entering the target during the sputtering, cooling passages 12 are disposed at the bottom of the target 9, and they are concentric over a great part of their length and are sealed off by flat rings. The cathode base body 5 is equipped similarly with a cooling passage 25.

FIG. 2 shows a sputtering cathode into which any target from FIG. 1 can basically be installed.

In FIG. 1 there is shown a power feed plate 1, which is connected through a supporting insulator 2 to a vacuum chamber 3 which in turn is grounded at 4. The power feed plate 1 is connected by a line 41 to the power supply unit 40, which is designed as a direct-current source for the sputtering of metal or electrically conductive targets.

The cathode base body 5 is insulated from the power feed plate 1 but affixed thereto, with the interposition of insulators 15 with collars 15a of which several are distributed on the circumference, although only one is shown in the cross section. In FIG. 2 the target 9 corresponds generally to the one in FIG. 1, only the cooling passages 12 of FIG. 1 are formed by a doubled wound tube of square cross section which is held between the target 9 and the insulating body 12 by a plurality of tension screws 10 distributed on the circumference in order to assure a good transfer of heat.

The tension screws 10 pass through the power feed plate 1 with the interposition of the insulators 15 and also through the cathode base body 5 and produce the electrical connection to the target 9. For this purpose the target 9 is provided on its bottom with a circumferential rib 9f which has threaded bores engaged by the tension screws 10.

The ends of the clamping screws 10 are passed with sufficient insulating space through bores in the cathode body 5 and through a radial recess 1a in the power feed plate 1.

By the appropriate selection of the thickness of the insulator 11 and/or of the axial length of the pole shoes 23 and 24 it is possible to bring the sputtering surface 9a into a specific geometrical relationship to the pole faces 23a and 24a (right side of FIG. 2).

It can be seen that, on account of the insulators 11 and 15 of FIG. 1, the power feed plate 1 and the target 9 are electrically insulated both from the cathode base body 5 with the magnet system 7 and from the vacuum chamber 3 and ground 4. While the target can be brought to a definite negative potential through the power feed plate 1, and also ground 4 represents a definite potential (zero potential), the cathode body 5 with the magnet system 7 and part 24d is electrically free and can set itself at an intermediate potential given by the operating conditions, and when it is reached it very quickly and automatically produces the effect of preventing any sputtering of part 24d and hence of the magnet system 7. The power feed plate 1 can be provided with a dark-space shielding (not shown), so that any sputtering of the power feed plate toward the back is prevented.

The invention is by no means limited to a rotationally symmetrical arrangement. The cross section, according to FIG. 2 (an axial section), can also be considered as representative of a cross section through a so-called "long cathode" not represented in the drawing. The sputtering cathode can then be imagined as being prolonged in the vertical direction with respect to the plane of the drawing. Such cathodes can have lengths amounting easily to about 4 meters with a width of about 30 to 40 cm. All intermediate forms from circular to rectangular can be considered. The substrate 30 can then be coated with extreme uniformity as it moves relative to the cathode in the direction of an arrow 30a.

According to another embodiment it is also possible for the negative voltage at the pole shoes 23 and 24 between cathode potential and anode potential to be produced by an electrical voltage divider 44 instead of an additional power source, and the negative potential of the pole shoes 23 and 24 can be removed after the plasma ignites. This constitutes an ignition aid for the cathode (target) 9.

While there have been described what are at present considered to be the preferred embodiments of this invention, it will be obvious to those skilled in the art that various changes and modifications may be made therein without departing from the invention, and it is, therefore, aimed to cover all such changes and modifications as fall within the true spirit and scope of the invention.

What is claimed is:

1. Sputtering cathode for coating substrates in cathode sputtering apparatus, comprising:
   a cathode base body, a target (9) of nonmagnetic material with at least one flat sputtering surface (9a) disposed thereon;
   a magnet system with pole faces of opposite polarity lying on both sides of the target for producing a closed tunnel of magnetic lines of force spanning the sputtering surface; and
   pole shoes (23, 24) surrounding the target and reaching at least as far as the outer boundary of the target (9), said pole shoes including ring-like extensions configured as a ferromagnetic system and having a negative voltage between 50 volts and 250 volts with respect to the target.

2. Sputtering cathode according to claim 1, in which the ring-like extensions (24b) have approximately the same thickness as the pole shoes (23, 24).

3. Sputtering cathode according to claim 1, in which the extensions (24b) run on the same diameter as the pole shoes (23, 24).

4. Sputtering cathode according to claim 1, which includes a power supply unit with current regulation (40) and an electrical conductor 42 and in which the ring-like extensions of the pole shoes (23, 24) are connected by the electrical conductor (42) to the power supply unit.

5. Sputtering cathode according to claim 1, in which the extensions of the pole shoes (24b) have with respect to the target (9) different-sized diameters and are combined integrally with the pole shoes.

6. Sputtering cathode according to claim 1, in which a negative voltage at the pole shoes (23, 24) between cathode potential and anode potential is developed by an electrical voltage divider (44).

7. Sputtering cathode according to claim 1, in which the negative voltage of the pole shoes (23, 24) is removable after the ignition of a plasma.

* * * * *